United States Patent
Liu et al.

(10) Patent No.: US 12,188,150 B2
(45) Date of Patent: Jan. 7, 2025

(54) METHOD FOR CLONAL-GROWTH OF SINGLE-CRYSTAL METAL

(71) Applicant: PEKING UNIVERSITY, Beijing (CN)

(72) Inventors: Kaihui Liu, Beijing (CN); Zhibin Zhang, Beijing (CN); Muhong Wu, Beijing (CN); Dapeng Yu, Beijing (CN); Enge Wang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 602 days.

(21) Appl. No.: 17/433,756

(22) PCT Filed: Jun. 4, 2019

(86) PCT No.: PCT/CN2019/089912
§ 371 (c)(1),
(2) Date: Aug. 25, 2021

(87) PCT Pub. No.: WO2020/173012
PCT Pub. Date: Sep. 3, 2020

(65) Prior Publication Data
US 2022/0136134 A1    May 5, 2022

(30) Foreign Application Priority Data
Feb. 27, 2019    (CN) .......................... 201910144704.9

(51) Int. Cl.
C30B 29/02    (2006.01)
C30B 1/02    (2006.01)
C30B 29/64    (2006.01)

(52) U.S. Cl.
CPC ................ *C30B 29/02* (2013.01); *C30B 1/02* (2013.01); *C30B 29/64* (2013.01)

(58) Field of Classification Search
None
See application file for complete search history.

(56) References Cited

U.S. PATENT DOCUMENTS

| 4,634,491 | A | * | 1/1987 | Benn ....................... C30B 29/52 |
| | | | | 117/10 |
| 2015/0064496 | A1 | * | 3/2015 | Chen ..................... C30B 19/103 |
| | | | | 428/641 |

(Continued)

FOREIGN PATENT DOCUMENTS

| CN | 105603514 A | 5/2016 |
| CN | 105714382 A | 6/2016 |

(Continued)

OTHER PUBLICATIONS

Jin et al., Colossal grain growth yields single-crystal metal foils by contact-free annealing. Science. Nov. 30, 2018;362(6418):1021-1025.

(Continued)

*Primary Examiner* — George Wyszomierski
(74) *Attorney, Agent, or Firm* — Scully, Scott, Murphy & Presser, P.C.

(57) ABSTRACT

A method for clonal-growth of a single-crystal metal, including: using copper as an example, placing an existing small-sized single-crystal copper foil with a plane of any index on a copper foil that needs to be single-crystallized, and performing annealing to obtain, by cloning, a large-area (in meters) single-crystal copper foil with the same surface index as that of the parent facet. The method solves the difficult problem of large-area single-crystal copper foil preparation. By performing annealing, a parent single-crystal copper foil with a very small size (~0.25 cm²) can be cloned to produce a large-area (~700 cm²) single-crystal copper foil, which is an increase in area of about 3000 times.

9 Claims, 2 Drawing Sheets

Polycrystal copper foil                Single-crystal Cu(XYZ)

(56) References Cited

U.S. PATENT DOCUMENTS

| | | | |
|---|---|---|---|
| 2017/0191187 A1 | 7/2017 | Iudf-Hyu | |
| 2019/0242028 A1* | 8/2019 | Ruoff | C30B 29/02 |
| 2023/0340693 A1* | 10/2023 | Park | C30B 25/18 |

FOREIGN PATENT DOCUMENTS

| | | |
|---|---|---|
| CN | 107904654 A | 4/2018 |
| JP | S55162496 A | 12/1980 |
| JP | S582289 A | 1/1983 |
| JP | S58156588 A | 9/1983 |
| JP | H02263925 A | 10/1990 |

OTHER PUBLICATIONS

Wu et al., Seeded growth of large single-crystal copper foils with high-index facets. Nature. May 2020;581(7809):406-410.

Xu et al., Ultrafast epitaxial growth of metre-sized single-crystal graphene on industrial Cu foil. Sci Bull. Jul. 11, 2017;62:1074-80.

* cited by examiner

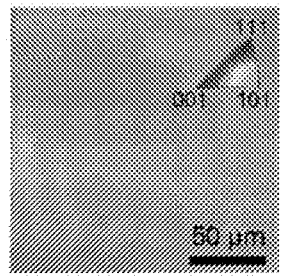 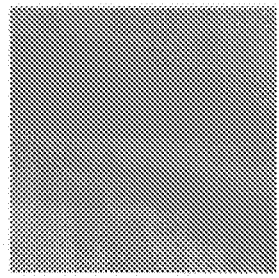
Fig. 3A　　　　Fig. 3B
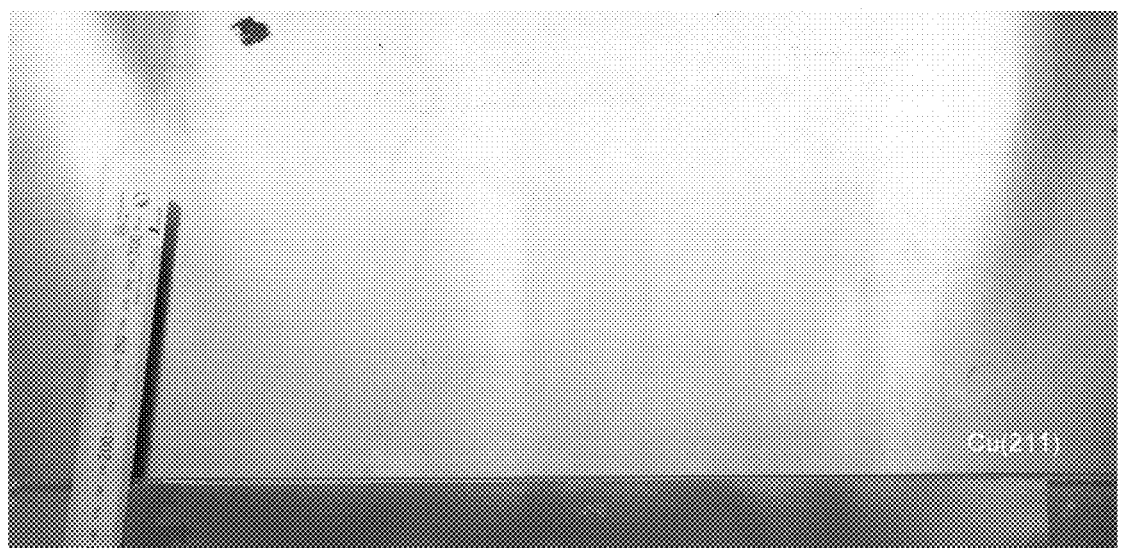
Fig. 4

METHOD FOR CLONAL-GROWTH OF SINGLE-CRYSTAL METAL

CROSS REFERENCE TO RELATED APPLICATIONS

The present application is a United States National Phase under 35 U.S.C. § 371 of International Application No. PCT/CN2019/089912, filed on Jun. 4, 2019, which claims priority under 35 U.S.C. § 119 of Chinese Application No. 201910144704.9, filed on Feb. 27, 2019, the disclosures of each of which are incorporated herein by reference for all purposes.

FIELD OF THE INVENTION

The disclosure relates to a method for clonal growth of single-crystal metal, in particular to a method for clonal growth of meter-level single-crystal copper foil using single-crystal copper with any surface index.

BACKGROUND OF THE INVENTION

Copper, as one of metals used earliest in human history, still has an extremely wide applications today with the rapid development of technology. For example, in electronic products such as mobile phones and computers, copper is the most common electricity-conductive connection metal; also, due to its superior thermal conductivity, using copper sheet to dissipate heat is currently the most common and optimal heat dissipation solution for mobile phones and computers. Due to the friendly price and superior performance, the role of copper will receive more attention in the future. Therefore, the production of large-area (meter-level) copper foil has an extremely important position in industrial development.

At present, the widely used industrial copper foil is generally polycrystal copper, which has the disadvantages of small crystal grains, many grain boundaries, and high defect density. These defects greatly reduce their electrical and thermal conductivity, so that the superior performance of copper foil cannot be fully utilized, and detracts from industrial applications. On the contrary, single-crystal copper has large crystal domains, no grain boundaries, and low defect density, and completely overcomes the defects of polycrystal copper. Therefore, the production of large-area (meter-level) single-crystal copper foil plays a very important role in the industrial application of copper.

SUMMARY OF THE INVENTION

The present disclosure provides a method for clonal growth of single-crystal metal. Taking copper as an example, the method comprises the following steps: providing a first single-crystal copper foil and a first polycrystal copper foil; placing the first single-crystal copper foil on the first polycrystal copper foil; and annealing to transform the first polycrystal copper foil into a large-sized second single-crystal copper foil having the same surface index as the first single-crystal copper foil by cloning with the small-sized first single-crystal copper foil as a clone matrix.

Preferably, the method comprises the following steps:
(1) using a single-crystal copper foil with any surface as the clone matrix;
(2) cutting the clone matrix into a small triangle shape as the first single-crystal copper foil, and placing it on the first polycrystal copper foil that needs to be single-crystallized;
(3) placing the stacked first polycrystal copper foil and first single-crystal copper foil in a heating furnace, introducing Ar gas at a flow rate of 300 sccm or more, and then raising the temperature for 60-100 minutes;
(4) introducing $H_2$ gas at a flow rate of 10-500 sccm when the temperature is raised to 1010-1050° C., while remaining the Ar flow rate unchanged; and annealing for 120 min-300 min; and
(5) turning off the power supply of the heating furnace after the annealing is finished, and cooling to room temperature naturally with Ar gas and $H_2$ gas as protective gases; the first polycrystal copper foil has been transformed into the second single-crystal copper foil with the same surface index as the first single-crystal copper foil, that is, the clonal growth process of the single-crystal copper foil is completed.

Preferably, the clone matrix is a single-crystal copper foil with any facet, including but not limited to Cu(111), Cu(110), Cu(211), Cu(345), Cu(346), Cu(335), Cu(236), Cu(124), Cu(553), Cu(122), Cu(255), Cu(256) and other facets.

Preferably, the shape of the small triangle is a right triangle whose hypotenuse is 1-5 cm.

Preferably, when the first single-crystal copper foil is placed on the first polycrystal copper foil, a flattening process is performed so that the first single-crystal copper foil is in sufficient contact with the first polycrystal copper foil.

In some embodiments of the present disclosure, the size of the first polycrystal copper foil is 39 cm*18 cm. As the volume of the tube furnace used becomes larger, the size of the first polycrystal copper foil may be larger.

Preferably, the annealing time is adjusted to ensure that the facet of the second single-crystal copper foil is consistent with the facet of the first single-crystal copper foil.

Preferably, the area of the first single-crystal copper foil is 1%-50% of that of the first polycrystal copper foil.

The present disclosure also provides a single-crystal copper foil, which is the second single-crystal copper foil prepared by the above method.

Preferably, the size of the single-crystal copper foil prepared by the above method is 39 cm*18 cm or more.

The present disclosure clones an existing single-crystal copper foil with any surface index to obtain a large-area (meter-level) single-crystal copper foil with the same surface index as that of the matrix by placing the existing single-crystal copper foil on the copper foil that needs to be single-crystallized and treating them with an annealing process. The method proposed by the present disclosure solves the problem that a single-crystal copper foil is difficult to be prepared. Through the annealing process, a single-crystal copper foil with a large size (about 700 $cm^2$) is prepared by cloning a single-crystal copper foil matrix with a very small size (about 0.25 $cm^2$), and the area is expanded by about 3000 times!

The advantages of the present disclosure are:
1. the present disclosure is a method for clonal growth of single-crystal metal, including but not limited to single-crystal copper foil;
2. by selecting a commercially available polycrystal copper foil as a raw material without the need for complex surface pretreatment of the copper foil, the present disclosure can provide a super-large single-crystal copper foil with any surface index which greatly reduces the preparation cost;
3. the present disclosure proposes a method for preparing a single-crystal copper foil by clonal growth for the first time, and the prepared single-crystal copper foil has good application prospects due to its large size, few defects, and superior performance; and 4. the method of the present disclosure is simple, effective, and low in cost, and is helpful for the practical application and industrial production of a large-size single-crystal copper foil.

BRIEF DESCRIPTION OF THE DRAWINGS

FIG. 2 takes Cu(211) surface as an example and shows a process of obtaining single-crystal Cu(211) by cloning.

FIG. 3a is the EBSD result of Cu(211) matrix, and FIG. 3b is the EBSD result of Cu(211) induced after cloning.

FIG. 4 shows a large-area single-crystal Cu(211) obtained after the cloning is completed.

DETAILED DESCRIPTION OF THE INVENTION

The present disclosure will be further described in detail below in conjunction with specific examples, but the inventive method is not limited to the following examples.

In the following examples, the methods are conventional methods unless otherwise specified; and the raw materials can be obtained commercially unless otherwise specified.

Example 1: A method for clonal growth of single-crystal metal, including the following steps:
(1) using a single-crystal copper foil with any facet as a clone matrix; here single-crystal Cu(211) was used;
(2) cutting the obtained matrix into a standard small right-angled triangle shape with a hypotenuse size of 2 cm, and placing it on a polycrystal copper foil with a size of 9 cm*5 cm that needed to be single-crystallized;
(3) placing the copper foil in a tube furnace, introducing Ar gas at a flow rate of 800 sccm, and then starting to raise the temperature, wherein the temperature raising process lasted for 80 minutes;
(4) introducing $H_2$ gas at a flow rate of 50 sccm when the temperature was raised to 1030° C., while remaining the Ar flow rate unchanged; and then annealing, wherein the annealing process lasted for 90 minutes; and
(5) turning off the power supply of the heating furnace after the annealing was finished, and cooling to room temperature naturally with Ar gas and $H_2$ gas as protective gases.

Figure 1:
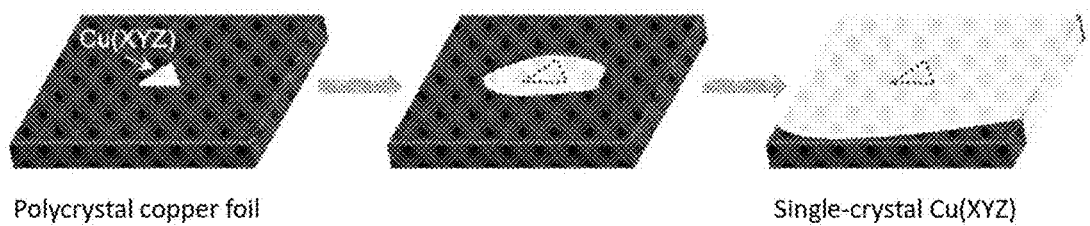
FIG. 1 is a schematic diagram of using a single-crystal copper with any surface index (Cu(xyz)) as a matrix to transform an underlying polycrystal copper foil into a single-crystal copper foil with the same surface index (Cu (xyz)) by cloning during an annealing process in a tube furnace.
Figures 2A, 2B, 2C:
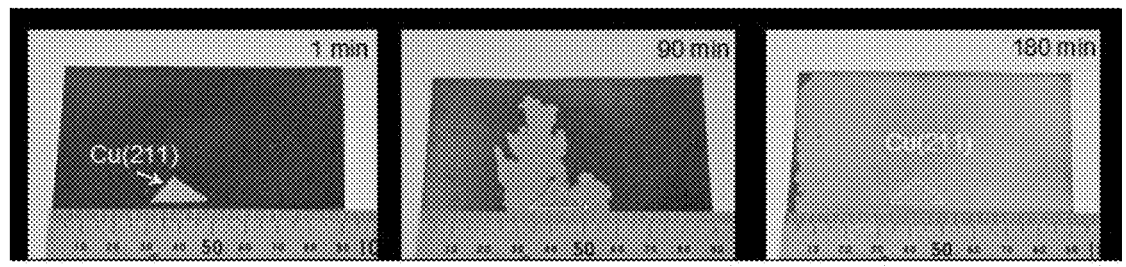
In FIG. 2a of the process, a triangle with a hypotenuse of 2 cm is used as a matrix and a polycrystal copper foil with a size of 9 cm*5 cm is taken as an example, and 98% of the whole polycrystal copper foil in FIG. 2c is converted to Cu(211) after 180 minutes of annealing treatment.
FIG. 2b shows that a part of the polycrystal copper foil in FIG. 2b is converted to Cu(211) after 90 minutes of annealing treatment.

The single-crystal copper foil prepared by cloning in this experiment was shown in FIG. 2(b). It can be seen that a facet consistent with that of the matrix was cloned around the single-crystal Cu(211) after annealing for 90 minutes. Different colors represented different facets. Therefore, it was known that we obtained the Cu(211) surface consistent with that of the matrix by cloning, which extended to ¼ of the area of the whole copper foil.

Example 2: A method for clonal growth of single-crystal metal, including the following steps:
(1) using a single-crystal copper foil with any facet as a clone matrix; here single-crystal Cu(211) was used;
(2) cutting the obtained matrix into a standard small right-angled triangle shape with a hypotenuse size of 2 cm, and placing it on a polycrystal copper foil with a size of 9 cm*5 cm that needed to be single-crystallized;
(3) placing the copper foil in a tube furnace, introducing Ar gas at a flow rate of 800 sccm, and then starting to raise the temperature, wherein the temperature raising process lasted for 80 minutes;
(4) introducing $H_2$ gas at a flow rate of 50 sccm when the temperature was raised to 1030° C., while remaining the Ar flow rate unchanged; and then annealing, wherein the annealing process lasted for 180 minutes; and
(5) turning off the power supply of the heating furnace after the annealing was finished, and cooling to room temperature naturally with Ar gas and $H_2$ gas as protective gases.

The single-crystal copper foil prepared by cloning in this experiment was shown in FIG. 2(c). It can be seen that after annealing for 180 minutes, we obtained the Cu(211) surface consistent with that of the matrix by cloning, which extended to greater than 98% of the area of the whole copper foil.

Example 3: A method for clonal growth of single-crystal metal, including the following steps:
(1) using a single-crystal copper foil with any facet as a clone matrix; here single-crystal Cu(211) was used;
(2) cutting the obtained matrix into a standard small right-angled triangle shape with a hypotenuse size of 1 cm, and placing it on to polycrystal copper foil with a size of 39 cm*18 cm that needed to be single-crystallized;
(3) placing the copper foil in a tube furnace, introducing Ar gas at a flow rate of 800 sccm, and then starting to raise the temperature, wherein the temperature raising process lasted for 80 minutes;
(4) introducing $H_2$ gas at a flow rate of 50 sccm when the temperature was raised to 1030° C., while remaining the Ar flow rate unchanged; and then annealing, wherein the annealing process lasted for 300 minutes; and
(5) turning off the power supply of the heating furnace after the annealing was finished, and cooling to room temperature naturally with Ar gas and $H_2$ gas as protective gases.

The single-crystal copper foil prepared by cloning in this experimental was shown in FIG. 4. FIG. 3(a) showed the EBSD of the clone matrix, and FIG. 3(b) was the EBSD of the large single-crystal copper induced. Both EBSD's proved to be single-crystal Cu(211), which also confirmed the reliability of the single-crystal cloning method. It can be seen that we obtained the Cu(211) surface consistent with that of the matrix by cloning, i.e., a large-area (meter-level) single-crystal copper foil was prepared.

What is claimed is:
1. A method for clonal growth of single-crystal metal, which comprises the following steps:
providing a first single-crystal copper foil and a first polycrystal copper foil;
placing the first single-crystal copper foil on the first polycrystal copper foil; and
annealing to transform the first polycrystal copper foil into a second single-crystal copper foil having the same surface index as the first single-crystal copper foil by cloning with the first single-crystal copper foil as a clone matrix, wherein the second single-crystal copper foil has a larger size than the first single-crystal copper foil.

2. The method according to claim 1, which comprises the following steps:
   (1) using a single-crystal copper foil with any facet as the clone matrix;
   (2) cutting the clone matrix into a small triangle shape as the first single-crystal copper foil, and placing it on the first polycrystal copper foil that needs to be single-crystallized;
   (3) placing the stacked first polycrystal copper foil and first single-crystal copper foil in a heating furnace, introducing Ar gas at a flow rate of 300 sccm or more, and then raising the temperature for 60-100 minutes, until the temperature is raised to 1010-1050° C.;
   (4) introducing $H_2$ gas at a flow rate of 10-500 sccm, while the Ar flow rate is unchanged; and annealing for 120 min-300 min; and
   (5) turning off the power supply of the heating furnace after the annealing is finished, and cooling to room temperature naturally with Ar gas and $H_2$ gas as protective gases; the first polycrystal copper foil has been transformed into the second single-crystal copper foil with the same surface index as that of the first single-crystal copper foil to complete the clonal growth process of the single-crystal copper foil.

3. The method according to claim 2, wherein the facets of the clone matrix is selected from the group consisting of Cu(111), Cu(110), Cu(211), Cu(345), Cu(346), Cu(335), Cu(236), Cu(124), Cu(553), Cu(122), Cu(255), and Cu(256).

4. The method according to claim 2, wherein the shape of the small triangle is a right triangle whose hypotenuse is from 1 cm to 5 cm.

5. The method according to claim 2, wherein in step (2), when the first single-crystal copper foil is placed on the first polycrystal copper foil, a flattening process is performed.

6. The method according to claim 2, wherein the size of the first polycrystal copper foil is 39 cm*18 cm or more.

7. The method according to claim 1, wherein the annealing time is adjusted to ensure that the facet of the second single-crystal copper foil is consistent with the facet of the first single-crystal copper foil.

8. The method according to claim 1, wherein the area of the first single-crystal copper foil is 1%-50% of that of the first polycrystal copper foil.

9. The method according to claim 1, wherein the second single-crystal copper foil has a size of 39 cm*18 cm or more.

* * * * *